United States Patent

Lee et al.

[11] Patent Number: 5,844,421
[45] Date of Patent: Dec. 1, 1998

[54] PROBE CONTROL METHOD FOR LEVELING PROBE PINS FOR A PROBE TEST SEQUENCE

[75] Inventors: Si-Hyoung Lee, Seoul; Seung-Hwan Park; Kyoung-Ho Yang, both of Suwon; Gun-Won Lee, Kyungki-do, all of Rep. of Korea

[73] Assignee: Samsung Electronis Co., Ltd., Suwon, Rep. of Korea

[21] Appl. No.: 645,498

[22] Filed: May 16, 1996

[30] Foreign Application Priority Data

May 17, 1995 [KR] Rep. of Korea ................... 95-12231

[51] Int. Cl.[6] ................................................. G01R 31/02
[52] U.S. Cl. ................................. 324/758; 324/754
[58] Field of Search ................................. 324/758, 754, 324/519, 762, 755

[56] References Cited

U.S. PATENT DOCUMENTS

| | | | |
|---|---|---|---|
| 4,565,966 | 1/1986 | Burr et al. | 324/519 |
| 4,918,374 | 4/1990 | Stewart et al. | 324/758 |
| 4,975,638 | 12/1990 | Evans et al. | 324/754 |
| 5,006,808 | 4/1991 | Watts | 324/537 |
| 5,065,092 | 11/1991 | Sigler | 324/758 |
| 5,561,377 | 10/1996 | Strid et al. | 324/754 |
| 5,659,255 | 8/1997 | Strid et al. | 324/754 |
| 5,691,467 | 11/1997 | Goldmann et al. | 73/105 |

*Primary Examiner*—Josie Ballato
*Assistant Examiner*—Anh Phung
*Attorney, Agent, or Firm*—Jones & Volentine, L.L.P.

[57] ABSTRACT

A probe control method of a probe station which levels the probe pins before testing a large area substrate such as a thin film transistor circuit substrate using a probe station, which includes the steps of connecting a pin of a probe station to a resistance material; measuring and reading the resistance between adjacent pins using a resistance measuring device; and leveling the probe pins using a pin control device at the probe station.

4 Claims, 5 Drawing Sheets

$R_1 > R_2 > R_3 > \cdots > R_n$
(n:Pin No.)

$R_1 < R_2 < R_3 < \cdots < R_n$ $R_1 \simeq R_2 \simeq R_3 \simeq \cdots \simeq R_n$

PROBE CONTROL METHOD FOR LEVELING PROBE PINS FOR A PROBE TEST SEQUENCE

BACKGROUND OF THE INVENTION

A. Field of the Invention

The present invention relates to a probe control method for a probe station. More particularly, the present invention relates to a probe control method for a probe station which levels the probe pins of the probe station before using the probe station to test a large area substrate such as a thin film transistor circuit substrate.

B. Description of the Prior Art

Generally, a thin film transistor (TFT) liquid crystal display includes a color filter substrate having a color filter, a TFT transistor substrate having a TFT transistor and pixels, and a liquid crystal element sealed between the color filter substrate and the TFT substrate.

In the TFT transistor substrate, a plurality of gate lines and a plurality of data lines are connected to the TFT transistor. The gate lines are connected to the gate electrodes in the TFT transistor, and the data lines are connected to source electrodes in the TFT transistor.

Gate pads each transmit a gate voltage from a gate driver to a gate line from among the plurality of gate lines, and the data pads each transmit a data voltage from a data driver to a data line from among the plurality of data lines.

In a typical TFT transistor substrate a plurality of data lines are formed from a plurality of data pads in a column, and a plurality of gate lines are formed from a plurality of gate pads in a row. When the TFT is a finished product (e.g., liquid crystal display (LCD)), external circuits are connected to the data pads and the gate pads, respectively, whereby a signal is applied.

However, when the TFT is not a finished product LCD, the signal is applied to the TFT via pads of the TFT by contacting the TFT with a plurality of probe pins at a probe station.

A typical probe station for testing a TFT may be explained as follows: a probe station is used to test whether a TFT or finished product LCD is good or bad by applying signals to test the display of either the TFT or the finished product LCD.

However, when probe pins of the probe station are bent or tilted, the test of either the TFT or finished product LCD is not accurate. Accordingly, the probe pins at the probe station should be levelled prior to testing the TFT or LCD to ensure test accuracy.

If one or more of the probe pins at the probe station is bent, the result is that the probe station is not leveled. In other words, the height of one or more of the probe pins is not leveled to a uniform height prior to testing the TFT or LCD.

Also, if one or more of the probe pins at the probe station is tilted by an angle of inclination that is different from the remainder of the probe pins at the probe station, the result is that the probe station is not leveled. In other words, the angle of one or more of the probe pins in not leveled to a uniform angle prior to testing the TFT or LCD.

Importantly, when one or more of the probe pins at a probe station is bent or tilted, such probe pin(s) would have a different resistance value than the resistance value of a probe pin which is neither bent nor tilted at an undesired angle of inclination.

Therefore, the height of each probe pin and its angle of inclination at a probe station should be leveled to provide a substantially uniform resistance for each probe pin at the probe station.

Generally, methods for leveling the plurality of probe pins at a probe station before testing a large area substrate, such as a thin film transistor circuit substrate, have utilized either an edge sensor or a photo sensor to aid in leveling the plurality of probe pins prior to testing.

First, the leveling method which uses an edge sensor may be explained as follows: the alignment of a probe card having a plurality of probe pins is controlled by installing a mechanical switch which is turned ON or OFF (toggled) when the probe pins are contacted to the large area substrate.

In such a method it is possible to control an individual probe when using a single probe card having a plurality of probe pins (such as with a smaller area substrate). However, it is difficult to control an individual probe when using a plurality of probe cards (such as may be necessary for a larger area substrate) with each probe card having a plurality of probe pins.

The edge sensor method has an additional disadvantage in that it is difficult to install the edge sensors with respect to proper alignment with the test pads of the substrate, particularly when testing a large area TFT for a large area LCD, or when testing a large area LCD. If the edge sensor is not used, it is difficult to precisely control each probe block.

Second, the leveling method which uses a photo sensor may be explained as follows: the photo sensor leveling method is essentially as described for the edge sensor leveling method, but an intermittent switch is utilized with the photo sensor instead of a mechanical switch. When current flows in the pins, a lamp connected to the pins glows. At this time, the photo sensor senses the light, thereby checking that the current flows. However, the photo sensor detection does not determine whether the probe pins are leveled by the photo sensor, since it only indicates whether current flows. While such an intermittent switch as utilized with the photo sensor is difficult to precisely control, it is less disadvantageous than the above-mentioned probe control method using the edge sensor and mechanical switch.

SUMMARY OF THE INVENTION

Accordingly, an object of the present invention is to provide a probe control method for a probe station, wherein a plurality of probe pins are leveled in a series of steps before a large area substrate (such as a thin film transistor circuit substrate) is tested using the probe station, whereby one or more of the problems due to the limitations and disadvantages of the prior art are substantially obviated.

To achieve these and other objects in accordance with the purpose of the invention, as embodied and broadly described herein, the probe control method comprises the steps of:

(a) connecting a pin of a probe station having a plurality of probe pins to a resistance material, (b) measuring and reading the resistance between adjacent pins using a resistance measuring device, and (c) leveling a probe pin of the plurality of probe pins using a pin control device of the probe station; and (d) optionally repeating steps (a)–(c) until the plurality of probe pins are leveled.

According to another aspect of the present invention, the invention provides a probe control method comprising the steps of:

(a) forming a plurality of probe blocks at a probe station by selectively grouping into designated units a plurality of probe pins as probe blocks from among the plurality of probe pins of the probe station;

(b) connecting a resistance material to a plurality of probe pins of a probe block;

(c) measuring and reading the resistance between adjacent probe pins of a probe block using a resistance measuring means;

(d) leveling a probe pin of the probe block using a pin controller in the probe station;

(e) repeating steps (a)–(d) until the resistances for each of the probe pins of the probe block are substantially equal;

(f) repeating steps (a)–(d) to level a plurality of probe pins in the plurality of probe blocks of the probe station; and (g) controlling the resistance values of each probe block of a plurality of probe blocks by controlling the height or angle of inclination of the plurality of probe pins of each probe block of the probe station, whereby the resistance values for each of the probe blocks of designated units of the probe station are provided as substantially equal.

It is to be understood that both the foregoing general description and the following detailed description are exemplary and explanatory and are intended to provide further explanation of the invention as claimed.

BRIEF DESCRIPTION OF THE DRAWINGS

The foregoing and other objects, aspects and advantages will be better understood from the following detailed description of a preferred embodiment of the invention with reference to the drawings, in which.

DESCRIPTION OF THE PREFERRED EMBODIMENT

Figure 1:
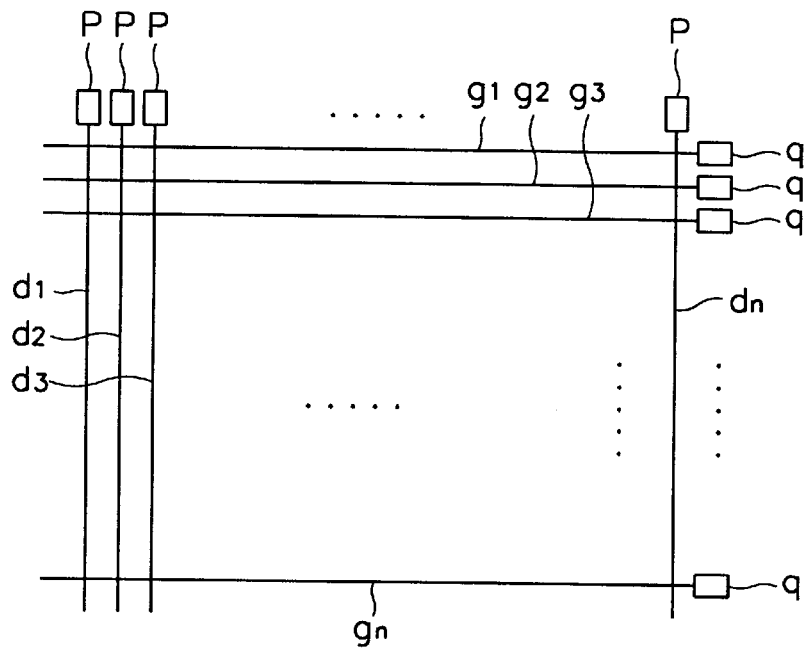
FIG. 1 is a plan view illustrating a TFT transistor substrate.

Reference will now be made in detail to a preferred embodiment of the present invention, examples of which are illustrated in the accompanying drawings. The accompanying drawings, illustrate one embodiment of the invention and, together with the textual description below, serve to explain the principles of the invention. Wherever possible in the drawing and in the textual discussion of the drawings, the same reference numbers are used throughout to refer to the same or like elements of the structures illustrated or described.

FIG. 1 is a plan view illustrating a TFT transistor substrate having a plurality of data lines (d1, d2, d3, ..., dn) formed from a plurality of data pads P in a column, and a plurality of gate lines (g1, g2, g3, ..., gn) formed from a plurality of gate pads q in a row. The TFT transistor substrate of FIG. 1 comprising a plurality of data pads P and a plurality of gate pads q may be completed to form a large area LCD. External circuits may be connected to data pads P and gate pads q, whereby a signal may be applied.

Figure 2:
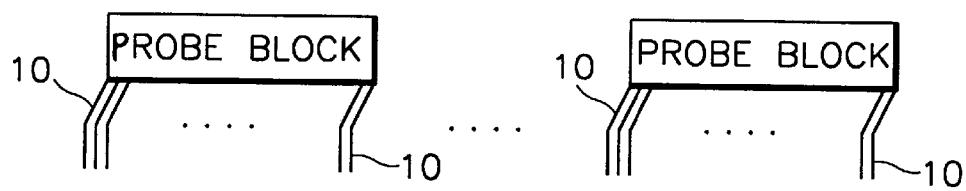
FIG. 2 is a view illustrating probes which are not leveled due to bending of one or more probes.

FIG. 2 is a view illustrating a group of probe pins 10, one or more of which is not leveled due to a bend in one or more of probe pins 10.

Figure 3:
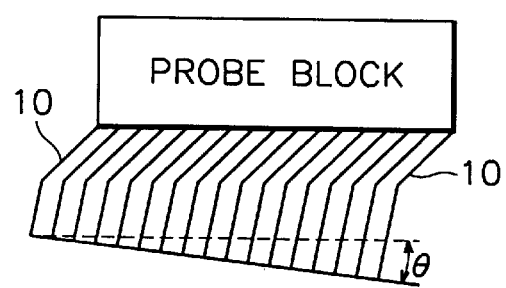
FIG. 3 is a view illustrating probes which are not leveled due to an improper pin angle due to tilting of one or more probes at the wrong pin angle.

FIG. 3 is a view illustrating a group of probe pins 10 having an angle of inclination θ, one or more of which probe pins 10 is not leveled due to being tilted at an improper angle of inclination θ.

Referring to FIGS. 2 and 3, when one or more of the probe pins 10 is bent or tilted at an improper angle θ, each such bent or tilted probe pin 10 has a different resistance value than the resistance value of a probe pin 10 which is not bent and does not have a tilt with a corresponding improper angle of inclination θ. Accordingly, the height and angle of inclination θ of a probe pin 10 should be leveled to provide a substantially uniform resistance for each probe pin in a designated unit.

Figure 4:
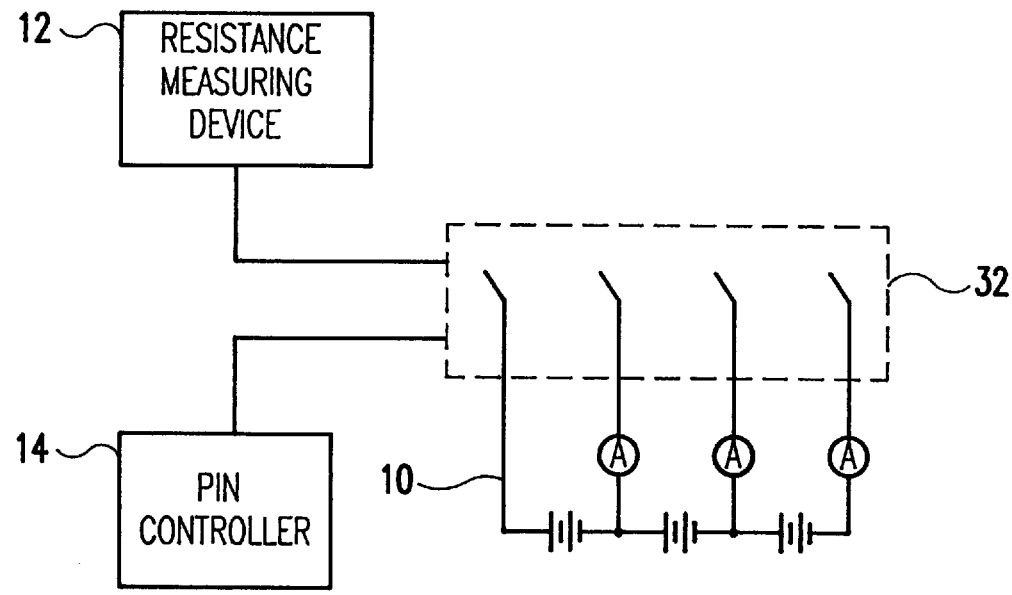
FIG. 4 is a diagram illustrating a method for obtaining a resistance measurement according to a first preferred embodiment of the present invention.
Figure 5:
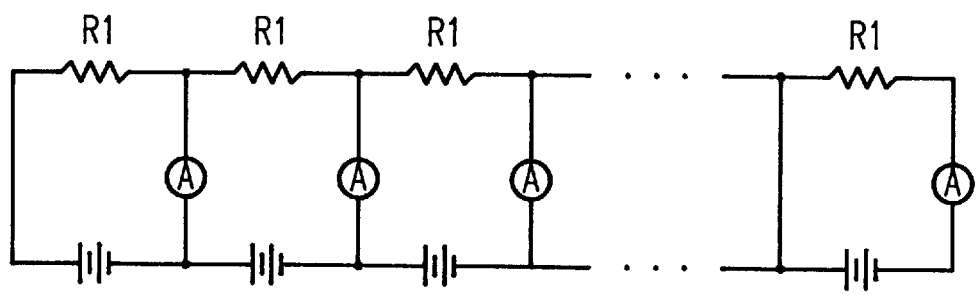
FIG. 5 is an electrical circuit diagram which illustrates the resistance measurement for a TFT transistor substrate in contact with a probe station in one embodiment of the present invention.
Figure 6:
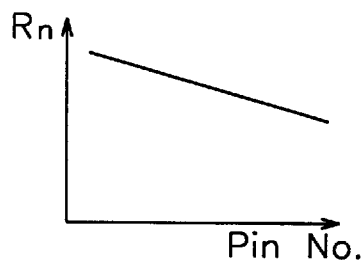
FIG. 6 is a graph showing the first probe pin having the highest resistance value according to the first preferred embodiment of the present invention.
Figure 7:
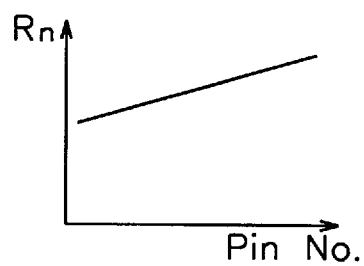
FIG. 7 is a graph showing the last probe pin having the highest resistance value according to the first preferred embodiment of the present invention.
Figure 8:
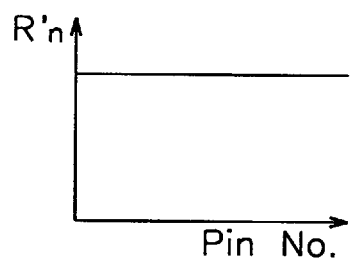
FIG. 8 is a graph showing all the probe pins of a probe block having the same resistance value according to the first preferred embodiment of the present invention.

FIG. 4 is a diagram illustrating a method for obtaining a resistance measurement according to a first preferred embodiment of the present invention; FIG. 5 is a circuit diagram corresponding to the measurement occurring in FIG. 4; FIG. 6 is a graph of resistance measurements which illustrates a measurement showing a first probe pin 10 having the highest resistance value according to the first preferred embodiment of the present invention; FIG. 7 is a graph of resistance measurements which illustrates a measurement showing a last probe pin 10 having the highest resistance value according to the first preferred embodiment of the present invention; and FIG. 8 is a graph of a resistance measurement illustrating a measurement showing all the probe pins having substantially the same resistance value according to the first preferred embodiment of the present invention.

A probe control method according to a first preferred embodiment of the present invention includes the steps of connecting a probe pin of a probe station to a resistance material 32; measuring and reading the resistance between adjacent pins 10 using a resistance measuring device 12; and leveling the probe pins using a pin controller 14 in the probe station.

The probe control method according to the first preferred embodiment of the present invention is explained in detail as follows.

Referring to FIG. 4, the probe pin 10 of the probe station is contacted with the resistance material 32. Examples of acceptable materials for resistance material 32 are indium tin oxide (ITO), chromium (Cr), and the like.

Next, the resistance between the adjacent probe pins 10 is measured by a resistance measuring device 12, such as, for example, an oscilloscope or the like.

The resistance between the adjacent probe pins 10 ($R_1$, $R_2$, $R_3$ ... $R_n$) are measured and read using the resistance measuring device 12. Such a probe pin resistance measurement may indicate that one or more of the probe pins is/are not leveled as illustrated in FIGS. 6 and 7, or may indicate that the probe pins are leveled as illustrated in FIG. 8. If necessary one or more probe pins is leveled using a pin controller 14 (pin controllers are readily available in the art), and a new resistance measurement at the probe station is taken. Such steps are repeated at the probe station until a resistance measurement is obtained at the probe station as illustrated in FIG. 8.

Figure 9:
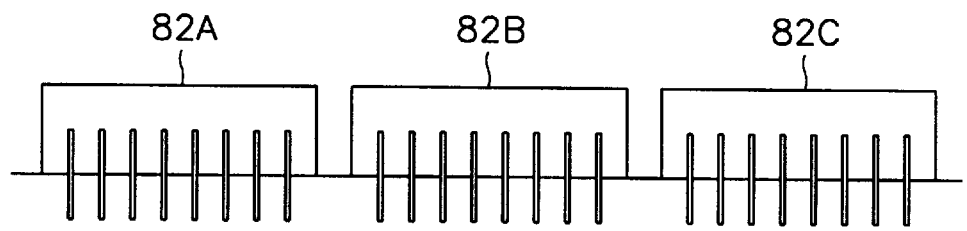
FIG. 9 is a view illustrating probe blocks of a probe station according to a second preferred embodiment of the present invention.
Figure 10:
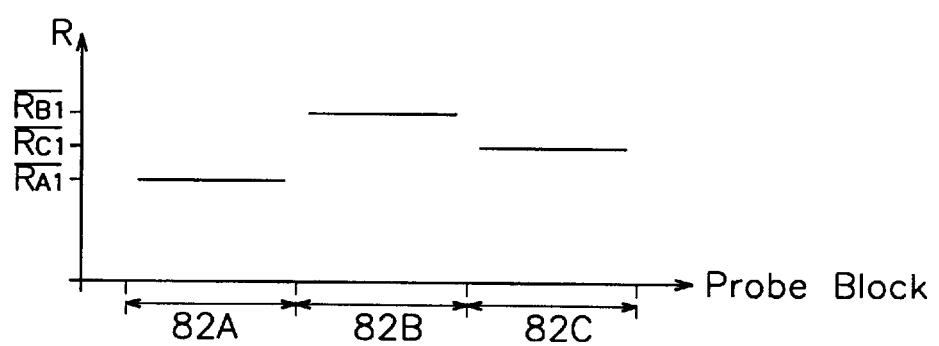
FIG. 10 is a graph showing unequal resistance values of probe blocks of a probe station according to a second preferred embodiment of the present invention.
Figure 11:
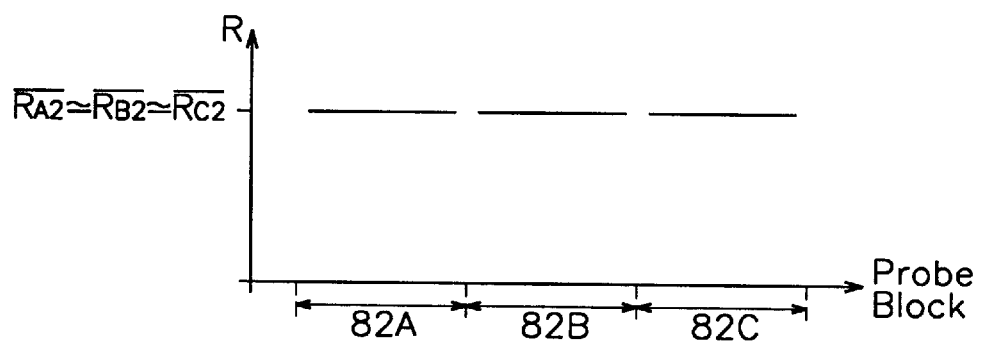
FIG. 11 is a graph showing resistance values after the resistance values of probe blocks of a probe station according to the second preferred embodiment of the present invention are substantially leveled by a probe resistance controller.
Figure 12:
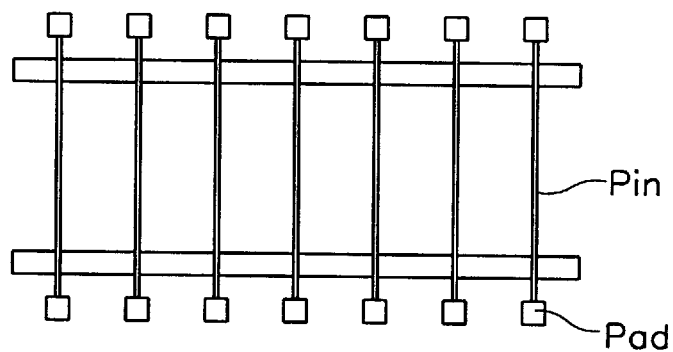
FIG. 12 is a view illustrating a method for measuring resistance between adjacent probe pins according to the first preferred embodiment of the present invention.

FIG. 9 is a view illustrating probe blocks of a probe station according to a second preferred embodiment of the present invention; FIG. 10 is a graph showing the resistance values of probe blocks of a probe station according to a second preferred embodiment of the present invention, FIG. 11 is a graph showing the resistance values of the probe blocks of a probe station after the resistance values have been leveled by a probe resistance controller according to the second preferred embodiment of the present invention; and FIG. 12 is a view illustrating a method for measuring resistance between adjacent probe pins according to the first preferred embodiment of the present invention.

A probe control method according to a second preferred embodiment of the present invention includes the steps of designating probe blocks (such as are indicated in FIG. 9, which shows probe blocks 82A, 82B and 82C) by grouping several probe pins among a plurality of probe pins of the probe station; contacting a resistance material to at least one probe block among the probe blocks 82A, 82B and 82C; measuring and reading the resistance between adjacent probe pins using a resistance measuring device 12; leveling the probe pins in the probe block using a pin controller 14 in the probe station; repeating the above-mentioned steps to level the probe pins for the other probe blocks among the designated probe blocks; and controlling the resistance values at probe blocks 82A, 82B and 82C by controlling the height and/or angle of inclination of the probe pins in the probe blocks 82A, 82B and 82C to provide probe blocks having substantially equal resistance values.

The probe control method according to the second preferred embodiment of the present invention is explained in detail as follows.

The probe blocks 82A, 82B and 82C are designated by grouping several probe pins among a plurality of probe pins in the probe station, and a resistance material is contacted with probe pins in one or more probe blocks among the probe blocks 82A, 82B and 82C. The resistance between the adjacent probe pins 10 in a probe block are measured and read using a resistance measuring device 12, and the probe pins in the probe block are leveled by a pin controller 14 at the probe station. The resistance measuring device 12 and pin controller 14 are similar to that described above with regard to the first embodiment.

Leveling of the probe pins 10 in the probe blocks is repeated for the other probe blocks among the designated probe blocks according to the above-mentioned steps and resistance measurements for the probe block are taken.

The initial resistance measurement results that may be obtained are illustrated in FIG. 10, which shows different resistance values of $R_{A1}$, $R_{B1}$ and $R_{C1}$ for the probe blocks 82A, 82B and 82C, respectively. This indicates that the heights or angles of inclination of the probe pins 10 of the designated probe blocks are different. In such a case the probe pins 10 of the probe blocks 82A, 82B and 82C are leveled as described above. If unequal resistance values are still observed as illustrated by FIG. 10, then the leveling and measuring steps described above for the probe blocks are repeated until a substantially equal resistance result is obtained for probe blocks 82A, 82B and 82C, as illustrated in FIG. 11.

Alternatively, the observed measurements may initially indicate that the resistance values of $R_{A1}$, $R_{B1}$ and $R_{C1}$ for the probe blocks 82A, 82B and 82C, respectively, are substantially the same as illustrated in FIG. 11.

The above-mentioned method is useful to precisely control a liquid crystal display probe station unit having a plurality of probe blocks.

In addition, the resistance values are made substantially uniform after measuring the resistance between the adjacent pins, thereby making the contact of the pins to the substrate substantially uniform. The contact uniformity of the pins is maintained in the same method on the opposite side after measuring the resistance, and it can be determined whether the circuit is intermittent by measuring the resistance between the pin and the opposite pin.

The effect of the present invention lies in that each probe block can be precisely controlled by measuring and reading the resistance values of each probe pin to level the probe pins of the probe station before testing the thin film transistor circuit substrate.

Other embodiments of the invention will be apparent to the skilled in the art from consideration of the specification and practice of the invention disclosed herein. It is intended that the specification and examples be considered as exemplary only and do not limit the scope of the following claims. The true scope and spirit of the invention is indicated by the following claims and may be apparent to the ordinary practitioner in this field by considering the description of the invention, the drawings and the examples provided by the above specification.

What is claimed is:

1. A method for leveling probe pins of a probe assembly, comprising:

(a) placing the probe pin assembly in contact with a resistance material;

(b) measuring, for each pair of adjacent probe pins, a resistance of a conductive path including a first probe pin of each pair, a second probe pin of each pair, and the resistance material between the first and second probe pins of each pair, using a resistance measuring device to obtain a resistance value for each pair of adjacent probe pins;

(c) comparing the resistance values of each pair of adjacent probe pins;

(d) determining the probe pin assembly to be acceptable when all of the resistance values for each pair of adjacent probe pins are substantially equal;

(e) adjusting the position of one or more of the plurality of probe pins using a pin controller when all of the resistance values for each pair of adjacent probe pins are not substantially equal; and (f) repeating (a) through (e) until all of the resistance values for each pair of adjacent probe pins in the probe assembly are substantially equal.

2. A method for leveling a plurality of probe blocks of a probe assembly, each probe block including a plurality of probe pins, comprising:

(a) placing a first probe block of the probe pin assembly in contact with a resistance material;

(b) measuring, for each pair of adjacent probe pins of the first probe block, a resistance of a conductive path including a first probe pin of each pair, a second probe pin of each pair, and the resistance material between the first and second probe pins of each pair, using a resistance measuring device to obtain a resistance value for each pair of adjacent probe pins;

(c) comparing the resistance values of each pair of adjacent probe pins;

(d) determining the first probe block to be acceptable when all of the resistance values for each pair of adjacent probe pins are substantially equal;

(e) adjusting the position of one or more of the plurality of probe pins of the first probe block using a pin controller when all of the resistance values for each pair of adjacent probe pins are not substantially equal;

(f) repeating (a) through (e) until all of the resistance values for each pair of adjacent probe pins in the first probe block are substantially equal, to obtain a resistance value for the first probe block;

(g) repeating (a) through (e) for each of the remaining probe blocks to obtain respective resistance values for each of the remaining probe blocks; and (h) comparing the respective resistance values for the plurality of probe blocks, and in the case where the resistance values are not substantially equal, adjusting a level of at least one of the probe blocks until the respective resistance values of the plurality of probe blocks are substantially equal.

3. The probe control method of claim 1, further comprising a step of:

adjusting the resistance values of each probe pin of the plurality of probe pins by controlling a height of each probe pin, whereby the resistance values for each of the probe pins is substantially equal.

4. The probe control method of claim 1, further comprising a step of:

adjusting the resistance values of each probe pin of the plurality of probe pins by controlling an angle of inclination of each probe pin, whereby the resistance values for each of the probe pins is substantially equal.

* * * * *